United States Patent
Ohmi et al.

(10) Patent No.: US 6,348,157 B1
(45) Date of Patent: *Feb. 19, 2002

(54) CLEANING METHOD

(75) Inventors: Tadahiro Ohmi, 1-17-301, Komegabukuro 2-chome, Aoba-ku, Sendai-shi, Miyagi-ken 980-0813; Takahisa Nitta, Tokyo; Kazuhiko Kawada, Miyagi-ken; Mitsunori Nakamori, Miyagi-ken; Toshihiro II, Miyagi-ken, all of (JP)

(73) Assignees: Tadahiro Ohmi, Miyagi-ken; Kabushiki Kaisha Ultraclean Technology Research Institute, Tokyo, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/097,278

(22) Filed: Jun. 12, 1998

(30) Foreign Application Priority Data

Jun. 13, 1997 (JP) .............................. 9-157037
Apr. 23, 1998 (JP) .......................... 10-129503
Apr. 23, 1998 (JP) .......................... 10-129638

(51) Int. Cl.$^7$ .......................... H01L 21/00; B08B 7/00
(52) U.S. Cl. ................. 210/760; 438/906; 134/1.3; 134/3
(58) Field of Search ............... 210/748, 760, 210/757; 438/906; 216/57, 96, 99; 134/1.3, 2, 3, 26, 28, 32

(56) References Cited

U.S. PATENT DOCUMENTS

| | | | | |
|---|---|---|---|---|
| 5,454,901 A | * | 10/1995 | Tsuji | 134/3 |
| 5,944,907 A | * | 8/1999 | Ohmi | 134/1.3 |
| 6,240,933 B1 | * | 6/2001 | Bergman | 134/1.3 |

FOREIGN PATENT DOCUMENTS

| | | |
|---|---|---|
| JP | 1-231984 A | 9/1989 |
| JP | 2-56293 A | 2/1990 |
| JP | 3-165519 A | 7/1991 |
| JP | 3-205824 A | 9/1991 |
| JP | 5-7705 A | 1/1993 |
| JP | 5-7869 A | 1/1993 |
| JP | 5-11458 A | 1/1993 |
| JP | 5-13395 A | 1/1993 |
| JP | 5-47735 A | 2/1993 |
| JP | 5-104672 A | 4/1993 |
| JP | 5-136114 A | 6/1993 |
| JP | 6-182558 A | 7/1994 |
| JP | 07014817 A | 1/1995 |
| JP | 07058076 A | 3/1995 |
| JP | 07142438 A | 6/1995 |
| JP | 07161672 A | 6/1995 |
| JP | 08148457 A | 6/1996 |
| JP | 08187474 A | 7/1996 |
| JP | 08187476 A | 7/1996 |
| JP | 08306655 A | 11/1996 |
| JP | 09010712 A | 1/1997 |
| JP | 09010713 A | 1/1997 |
| JP | 9194887 A | * 7/1997 |
| JP | 09194887 A | 7/1997 |
| JP | PCT/JP97/02311 | 7/1997 |
| WO | WO96/27898 | * 9/1996 |

* cited by examiner

*Primary Examiner*—David A. Simmons
*Assistant Examiner*—Frank M. Lawrence
(74) *Attorney, Agent, or Firm*—Randall J. Knuth

(57) ABSTRACT

A cleaning method capable of processing at room temperatures without conducting heating, uses little chemicals and water, and does not require special devices or materials. The chemical cleaning processes and rinse processes employ pure water or ultrapure water in a semiconductor wet cleaning process, rinse water or chemicals which suppresses formation of surface oxide films, removes particles and prevent their redeposition, and aids in the hydrogen termination of the silicon atoms. The cleaning method of the resent invention includes cleaning which is conducted using pure water containing ozone, cleaning conducted using a cleaning liquid containing HF, $H_2O$, and surfactant, while applying vibration having a frequency of 500 kHz or more, cleaning conducted using pure water containing ozone, cleaning conducted using a cleaning liquid containing HF and $H_2O$ in order to remove oxide films, and cleaning which is conducted using pure water. After cleaning a material to be cleaned using chemicals, rinsing is conducted using pure water or ultrapure water containing hydrogen gas in an amount of 0.5 ppm or more and containing oxygen gas in an amount of 100 ppb or less.

6 Claims, No Drawings

CLEANING METHOD

BACKGROUND OF THE INVENTION AND DESCRIPTION OF RELATED ART

1. Technical Field

The present invention relates to a cleaning method, and more particularly relates to a cleaning method which is capable of an ultrahigh level of cleaning using far fewer processes than conventional methods and without conducting heating operations.

2. Background Art

The semiconductor devices which are formed on semiconductor substrates have become more highly integrated and smaller, reaching the submicron level. In order to achieve this increase in integration, it is necessary to maintain the surface of the substrate in an ultraclean state. In other words, it is necessary to remove organic materials, metals, various types of particles and oxides (oxide films) from the surface of the substrate. It is for this reason that cleaning of the substrate is conducted.

In order to obtain a clean substrate surface, cleaning methods have been developed, all processes of which take place at room temperature, and in which chemical vapors are not generated.

In other words, a cleaning method is known (Japanese Patent Application, First Publication No. HEI 8-306655), which comprises a first process, in which cleaning is conducted by means of pure water containing ozone, a second process, in which, while applying vibrations having a frequency of 500 kHz or more, cleaning is conducted using a cleaning liquid containing HF, $H_2O_2$ and/or $O_3$, $H_2O$, and surfactant, a third process, in which cleaning is conducted by means of pure water, and a fourth process in which oxide films are removed.

In this method, the cleaning liquid containing HF, $H_2O_2$ and/or $O_3$, $H_2O$, and surfactant, which is employed in the second process, is a cleaning liquid which has very good cleaning properties, and the reactivity thereof is extremely high. This high degree of reactivity is extremely effective with respect to the substrate to be cleaned; however, because it is necessary to provide the members comprising the device with resistance to this highly active cleaning liquid, it is necessary to use materials for the device which have corrosion resistance. For this reason, a carbon layer is formed on top of a nickel fluoride layer in, for examples the inner surfaces of the cleaning liquid storage unit such as a metallic vessel (Japanese Patent Application, First Publication No. HEI 8-306655).

Furthermore, chemicals having good removal effects with respect to organic materials, metals, various types of particles, and oxides (oxide films) are employed as the solutions used in the cleaning of the semiconductor. However, in the cleaning process using pure water or ultrapure water which serves to conduct rinsing after cleaning with chemicals, there are no removal effects with respect to the organic materials, metals, various types of particles, or oxides (oxide films). On the contrary, there are reports of formation of oxide films as a result of the oxygen which is dissolved in the pure water or ultrapure water. Such growth of oxide films interferes with epitaxial growth after the oxide film removal process using, as an example, hydrofluoric acid. As a method for solving such problems, pure water or ultrapure water, termed deoxygenated water (deaerated water), in which the oxygen content in the pure water or ultrapure water is reduced to a level of a few ppb, is employed. Furthermore, it is known that the $n^+$ silicon surface (indicating n type silicon in which the doping level is in excess of $1 \times 10^{19}/cm^3$) experiences rapid oxidation. $n^+$ silicon is extremely important as a contact material for the formation of metallic electrodes in silicon type elements. It is desirable that the $n^+$ silicon surface remain unoxidized to the greatest extent possible, so that the contact resistance between the metal and the semiconductor does not increase. However, it is extremely difficult to suppress the growth of oxide films on $n^+$ silicon surfaces simply by employing deaerated water.

In the wet cleaning process of the silicon substrate, the surface of the substrate has no oxide film thereon after cleaning using a cleaning liquid containing hydrofluoric acid. However, substrates in such a state are especially subject to the deposition of various types of particles. In particular, in cases in which there is only a rinse process using pure water or ultrapure water after cleaning using a cleaning liquid containing hydrofluoric acid, the pure water or ultrapure water themselves do not have the effect of removing particles, so that this leads to defects in crystallization arising from such particles in later processes, such as film formation processes and the like.

After cleaning the silicon substrate using chemicals containing hydrofluoric acid in the wet cleaning process, the silicon atoms at the outermost surface of the substrate bond with hydrogen atoms, so that the outermost surface of the substrate adopts a structure in which termination with hydrogen atoms is observed. This hydrogen-terminated silicon surface is known to be extremely chemically stable. However, since not all silicon atoms are bonded to hydrogen atoms, the presence of silicon atoms in an unbonded state at the surface and the presence of silicon atoms which are bonded with fluorine molecules, has been observed. Such silicon atoms are chemically extremely unstable and are likely oxidation sites.

OBJECT AND SUMMARY OF THE INVENTION

The present invention has as an object thereof to provide a cleaning method, which is capable of room temperature processing without conducting heating, uses little chemicals and water, and does not require the use of special devices or materials.

The present invention also has as an object thereof to provide a cleaning method which, in the chemical cleaning process or the rinse process employing pure water or ultrapure water in the semiconductor wet cleaning process, restricts the formation of surface oxide films, removes, and prevents the deposition of, particles, and aids in the hydrogen termination of silicon atoms.

The cleaning method of the present invention comprises: a first process, in which cleaning is conducted using pure water containing ozone, a second process, in which, while applying vibration having a frequency within a range of 500 kHz–3 MHz, cleaning is conducted using a cleaning liquid containing HF, H$_2$O, and surfactant, a third process, in which cleaning is conducted using pure water containing ozone, a fourth process, in which oxide films are removed, and a fifth process, in which cleaning is conducted using pure water.

In the cleaning method of the present invention, after cleaning the target material with chemicals, rinsing is conducted using pure water or ultrapure water containing hydrogen gas in an amount of 0.5 ppm or more, and containing dissolved oxygen gas in an amount of 100 ppb or less.

In the present invention, the first cleaning which is conducted employs pure water containing ozone (first process). In this first process, the majority of the metals and organic materials are removed. By conducting this first process, it is possible to minimize variations in the surface roughness after all cleaning processes.

After the first process, it is possible to begin the cleaning of the second process employing chemicals containing HF, H$_2$O, and surfactant, without conducting ultrapure water cleaning. In other words, it is possible to omit one ultrapure water cleaning process ozone-containing ultrapure water remains on the substrate surface after the first process, but if the substrate proceeds to the second process with this water remaining on the surface thereof, there are no undesirable effects. It is preferable for the ozone concentration at this time to be within a range of 2 ppm–10 ppm. At amounts of less than 2 ppm, the removal of metals is insufficient, while when the amount is in excess of 10 ppm, the roughness of the substrate surface increases dramatically.

The second process involves cleaning using chemicals containing HF, H$_2$O and surfactant, while applying vibration of 500 kHz or more; particles and metals present in oxide films are removed by this cleaning. Furthermore, it is also possible to reduce the surface roughness thereby. An anionic, cationic, or nonionic surfactant may be employed here. The use of a nonionic surfactant, which reduces the surface tension of the solution, is particularly preferable.

The HF concentration is preferably within a range of 0.05 weight percent to 0.5 weight percent. The HF concentration is more preferably within a range of 0.1 weight percent to 0.5 weight percent. At amounts of Less than 0.05 weight percent, the etching of the oxide films is too slow, and the removal of metals can not be conducted smoothly. When HF is present in an amount greater than 0.5 weight percent, the roughness of the substrate surface increases dramatically.

It is preferable that the frequency of the vibration employed be within a range of 500 kHz to 3 MHz. When the frequency is less than 500 kHz, a static charge is produced on the substrate as a result of the large amount of friction of the water droplets produced by the vibration, and this leads to gate breakdown in the device. Furthermore, when the frequency is in excess of 3 MHz, the efficiency of the amplifier worsens as the frequency increases, so that it is necessary to employ a large amount of power in order to achieve a high output, and this is not practical. Processing may be conducted in each process from process 1 to process 5 while applying vibration within a range of 500 kHz to 3 MHz.

In process 3, the surfactant employed in process 2 remains on the surface of the substrate, so that cleaning is conducted using pure water containing ozone, and the surfactant is completely removed. The cleaning process is simplified if the ozone concentration is set so as to be the same as that in the first process.

In process 4, since the surface of the substrate was oxidized by the cleaning using ultrapure water containing ozone of process 3, cleaning is conducted using a dilute HF solution, and the oxide film is removed. The concentration of the dilute HF solution employed is within a range of 0.05% to 0.5%.

In process 5, cleaning (rinsing) is conducted using ultrapure water, and the slight amount of chemicals which have been deposited on the surface of the substrate are removed. At this time, when hydrogen is added to the ultrapure water, the surface of the substrate can be cleaned without oxidation, and at the same time, it is possible to prevent redeposition of foreign matter. It is has been learned that sufficient effects are obtained when only a very small hydrogen concentration of 1.6 ppm or less is employed.

Additionally, a highly reactive cleaning liquid, such as that containing HF, H$_2$O$_2$ and/or O$_3$, H$_2$O, and surfactant is not employed, so that it is not necessary to form a carbon layer on a nickel fluoride layer in the inner walls of the cleaning liquid storage unit comprising a metal vessel, and the inner walls posses sufficient resistance to the cleaning liquid simply by the formation of a nickel fluoride layer on the inner walls of the metallic vessel comprising the cleaning liquid storage unit.

In the present invention, by first adding hydrogen gas to pure water or ultrapure water, the effect is achieved of suppressing the formation of an oxide film. It was learned that the solution was effective from the extremely low added hydrogen concentration of 0.5 ppm. Furthermore, it is preferable that the concentration of the oxygen also dissolved at this time be 100 ppb or less. When an amount of oxygen in excess of 100 ppb is dissolved, it is impossible to completely suppress the formation of oxide films. This phenomenon is particularly pronounced on the surface of n$^+$ silicon.

By means of adding hydrogen gas to pure water or ultrapure water, it is possible to replace the lack of bonds, or other adsorbed atoms, on silicon with hydrogen atoms. By means of this, the hydrogen termination of the silicon surface is advanced, and since the silicon becomes less susceptible to electron exchange, the surface is stabilized. Effects were found from the extremely low added hydrogen concentration of 0.5 ppm. Furthermore, the concentration of the oxygen also dissolved at this time is preferably 100 ppb or less. When an amount of oxygen in excess of 100 ppb is present, the hydrogen-terminated surface is disrupted. This phenomenon is particularly pronounced at the surface of n$^+$ silicon.

By adding hydrogen gas to pure water or ultrapure water, and applying a vibration having a frequency of 500 kHz or more, it is possible to remove particles and to prevent their redeposition. However, it is preferable that the frequency of the vibration employed be within a range of 500 kHz to 3 MHz. When the frequency is less than 500 kHz, a static charge builds up on the substrate as a result of the large friction of the water droplets produced by the vibration, and this leads to device breakdown, while when the frequency is in excess of 3 MHz, the efficiency of the amplifier worsens as the frequency increases, so that it is necessary to apply a large amount of power in order to obtain a large output, and this is not practical. Furthermore, the hydrogen concentration necessary for removal of the dissolved particles and for prevention of the redeposition thereof is extremely low, at 0.5 ppm. Furthermore, at this time, it is preferable that the concentration of the oxygen which is also dissolved be 100 ppb or less. When oxygen is present in an amount of more than 100 ppb, formation of an oxide film is observed on the silicon surface.

By means of adding ozone or hydrogen peroxide to the hydrofluoric acid, it is possible to add the effect of preventing redeposition of particles to the ability to remove silicon oxide films of the hydrofluoric acid. It is preferable that the hydrofluoric acid concentration be between 0.05 weight percent and 1 weight percent, that the ozone concentration be within a range of 2 ppm to 10 ppm, and that the hydrogen peroxide be present in an amount within a range of 0.1 weight percent to 1 weight percent. When the hydrofluoric acid concentration is less than 0.05 weight percent, the solution exhibits almost no ability to etch the oxide film of the silicon. Furthermore, when the hydrofluoric acid concentration is in excess of 1 weight percent, the roughness of the surface of the substrate becomes extreme. Furthermore, when ozone is present in an amount of less than 2 ppm or hydrogen peroxide is present in an amount of less than 0.1 weight percent, there is no effect of preventing particle deposition. Furthermore, when ozone is present in an amount greater than 10 ppm or hydrogen peroxide is present in an amount greater than 1 weight percent, oxide film remains on the surface of the substrate.

The pure water which is discussed here is water having a resistivity of 15 MΩ/cm or more, and the ultrapure water is water having a resistivity of 18 MΩ/cm or more.

The following effects and benefits are obtained by the present invention;

1) There are extremely few processes;
2) Chemical vapors are not produced;
3) Processing can be completed using little chemicals and water;
4) With respect to chemicals, only HF is employed, and this is not mixed with other chemicals, so that recovery is facilitated;
5) All processes can be conducted at room temperature without conducting heating; and
6) A mild cleaning liquid is employed, so that it is not necessary to provide the materials with strong resistance to the solution.

Further, it is possible to suppress the formation of a natural oxide film in pure water or ultrapure water.

It is also possible to chemically stabilize the silicon surface.

It is also possible to provide particle removal effects to the pure water or ultrapure water.

Further, it is possible to suppress the deposition of particles in the wet cleaning process.

DETAILED DESCRIPTION OF PREFERRED EMBODIMENTS OF THE INVENTION

Embodiment 1

The upper part of a substrate was immersed in ultrapure water containing $CuCl_2$, and subsequently, this was cleaned using ultrapure water. By means of this, Cu was deposited on the surface of the substrate in an amount of $10^{12}$ atoms/cm$^2$.

This silicon substrate was cleaned using pure water containing 5 ppm of ozone for a period of 5 minutes (process 1), and then, while applying vibration having a frequency of 950 kHz, cleaning was conducted using a cleaning liquid containing 0.5% of HF, $H_2O$, and 50 ppm of a surfactant (process 2), then cleaning was conducted for a period of 5 minutes using pure water containing 5 ppm of ozone (process 3), cleaning was conducted using a cleaning liquid containing 0.5% HF and $H_2O$, in order to remove oxide films, for a period of 1 minute (process 4), and then cleaning was conducted for a period of 10 minutes using ultrapure water (process 5). Furthermore, the cleaning was conducted by immersing the substrate in the cleaning liquid. At this time, the inner surfaces within the device which came into contact with the cleaning liquid comprised members formed with a nickel fluoride layer on a stainless steel surface.

After the cleaning was completed, the Cu remaining on the substrate was analyzed using a total reflection fluorescent X-ray spectroscope. The results of the analysis are shown in Table 1.

Furthermore, the surface of the substrate was contaminated with Fe and Ni in place of Cu, the same cleaning was conducted, and this was analyzed using a total reflection fluorescent X-ray spectroscope. The results of the analysis are shown in Table 1.

Next, the surface of the substrate was contaminated using PSL particles having a diameter of 0.3 micrometers, the same type of cleaning was conducted, and the microparticle count was measured using a particle counter. The results of the analysis are shown in Table 1.

In order to confirm the residual presence of an oxide film on the surface of the silicon substrate, an attempt was made to detect a $SiO_2$ peak using an X-ray photoelectric spectroscope; however, the presence of a peak could not be observed, and it was thus confirmed that no oxide film remained.

This cleaning apparatus was employed continuously for a period of one month; however, there was no visible change in the state of the inner walls, which were formed with a nickel fluoride layer on stainless steel.

TABLE 1

|  | Before Cleaning | After Cleaning |
| --- | --- | --- |
| Cu | $1.2 \times 10^{12}$ atom/cm$^2$ | $1.0 \times 10^9$ atom/cm$^2$ or less |
| Fe | $5.5 \times 10^{11}$ atom/cm$^2$ | $1.0 \times 10^9$ atom/cm$^2$ or less |
| Ni | $8.6 \times 10^{11}$ atom/cm$^2$ | $1.0 \times 10^9$ atom/cm$^2$ or less |
| PSL particles | 1500 per 5 inch wafer | 80 per 5 inch wafer |

COMPARATIVE EXAMPLE

The upper part of a substrate was immersed in ultrapure water containing $CuCl_2$, and subsequently, this was cleaned with ultrapure water. By means of this, Cu was deposited on the surface of the substrate in an amount of $10^{12}$ atom/cm$^2$. Cleaning was conducted for a period of 5 minutes using pure water containing 5 ppm of ozone (process 1), and then, while applying vibration having a frequency of 950 kHz, cleaning was conducted for a period of 5 minutes using chemicals containing 0.5 weight percent of HF, 0.5 weight percent of $H_2O_2$, $H_2O$, and 50 ppm of surfactant (process 2), cleaning was conducted for a period of 5 minutes using ultrapure water (process 3), and then cleaning was conducted for a period of one minute using a cleaning liquid containing 0.5 weight percent of HF and $H_2O$, and after the oxide film had been removed, cleaning was conducted with pure water for a period of 10 minutes (process 4). Furthermore, the cleaning was conducted by immersing the substrate in the cleaning liquid. At this time, the inner surfaces of the device which were in contact with the cleaning liquid comprised members formed by placing a nickel fluoride layer on the surface of stainless steel.

After cleaning was completed, the Cu remaining on the substrate was analyzed using a total reflection fluorescent X-ray spectroscope. The results of the analysis are shown in Table 2.

Furthermore, the surface of the substrate was contaminated with Fe and Ni in place of Cu, the same sort of cleaning was conducted, and an analysis was conducted using a total reflection fluorescent X-ray spectroscope. The results of the analysis are shown in Table 2.

Next, the surface of the substrate was contaminated with PSL particles having a diameter of 0.3 micrometers, the same sort of cleaning was conducted, and the particle count was measured using a particle counter. The results of the analysis are shown in Table 2.

The cleaning apparatus was used continuously for a period of one month; the gloss on the inner surfaces, on which a nickel fluoride layer was formed on the stainless steel surface, was visually observed to have disappeared as a result of corrosion.

TABLE 2

|  | Before Cleaning | After Cleaning |
| --- | --- | --- |
| Cu | $1.2 \times 10^{12}$ atom/$cm^2$ | $1.0 \times 10^9$ atom/$cm^2$ or less |
| Fe | $5.5 \times 10^{11}$ atom/$cm^2$ | $1.0 \times 10^9$ atom/$cm^2$ or less |
| Ni | $8.6 \times 10^{11}$ atom/$cm^2$ | $1.0 \times 10^9$ atom/$cm^2$ or less |
| PSL particles | 1500 per 5 inch wafer | 70 per 5 inch wafer |

Embodiment 2

The silicon substrate was cleaned for a period of 5 minutes using ultrapure water containing 5 ppm of ozone (process 1), and then, while applying vibration having a frequency of 950 kHz, cleaning was conducted for a period of 5 minutes using a cleaning liquid containing 0.5% of HF, $H_2O$ and 50 ppm of a surfactant (process 2), then cleaning was conducted for a period of 5 minutes using ultrapure water containing 5 ppm of ozone (process 3), cleaning was conducted for a period of one minute using chemicals containing 0.5% HF and $H_2O$ in order to remove oxide films (process 4), and then cleaning was conducted for a period of ten minutes using ultrapure water to which hydrogen had been added in an amount of 1 ppm (process 5). Furthermore, the cleaning was conducted by immersing the substrate in the cleaning liquid.

At this time, contamination was conducted using Cu, Fe, and Ni in the same manner as in embodiment 1, and when the state of the cleaning of the metals was assessed, favorable results similar to those of embodiment 1 were obtained.

Next, the surface of the substrate was contaminated with PSL particles having a diameter of 0.3 micrometers, the same cleaning was conducted, and a particle count was conducted using a particle counter; favorable results similar to those of embodiment 1 were obtained.

In order to confirm the residual presence of oxide films on the surface of the silicon substrate, an attempt was made to detect a $SiO_2$ peak using X-ray photoelectric spectroscopy; however, such a peak could not be observed, and it was thus confirmed that there were no oxide films present.

Next, substrates which had been cleaned were continuously immersed for a period of 24 hours in pure water, and in pure water to which 1 ppm of hydrogen had been added.

The results of a measurement of the particle count on the wafers after immersion using a particle counter are shown in Table 3.

In order to assess the residual presence of oxide films on the surface of the silicone substrates after immersion, an attempt was made to detect a $SiO_2$ peak using X-ray photoelectric spectroscopy. The results thereof are shown in Table 3.

TABLE 3

|  | Ultrapure water immersion | Immersion in ultrapure water to which 1 ppm of hydrogen was added |
| --- | --- | --- |
| Particle count | 70 per 5 inch wafer | 60 per 5 inch wafer |
| Oxide film formation | Oxide film formation (peak detection) | No oxide film formation |

Embodiment 3

An n type (100) silicon substrate having a substrate concentration of $1.1 \times 10^{19}$/$cm^3$ was cleaned for a period of 10 minutes using chemicals in which 97% sulfuric acid and 30% hydrogen peroxide were mixed in a volumetric ratio of 4:1, and this was rinsed using ultrapure water at a flow rate of 1 L/min, and was then treated for a period of one minute using 0.5 weight percent hydrofluoric acid.

This substrate was then immediately transferred to a X-ray photoelectric spectroscope in which the measurement chamber had an attained vacuum degree of $1 \times 10^{-10}$ torr, the photoelectron angle was set to 5°, and an attempt was made to detect a $Si^{4+}$ ($SiO_2$) peak; however, no peak was observed.

On the other hand, after cleaning with 0.5 weight percent hydrofluoric acid, the silicon substrates were immediately rinsed with ultrapure water having a regulated amount of dissolved oxygen and amount of dissolved hydrogen (at a flow rate of 500 ml/min), and after 12 hours, and after 24 hours, the silicon substrates were retrieved, and an assessment of the $Si^{4+}$ ($SiO_2$) peak was carried out using X-ray photoelectric spectroscopy. The results thereof are shown in Tables 4 and 5.

TABLE 4

|  | Dissolved hydrogen concentration 0 ppm | Dissolved hydrogen concentration 0.2 ppm | Dissolved hydrogen concentration 0.5 ppm | Dissolved hydrogen concentration 1.0 ppm |
|---|---|---|---|---|
| Dissolved oxygen concentration 50 ppb | X | X | O | O |
| Dissolved oxygen concentration 100 ppb | X | X | O | O |
| Dissolved oxygen concentration 500 ppb | X | X | X | X |

X: Presence of $Si^{4+}$ peak   O: Absence of $Si^{4+}$ peak

TABLE 5

|  | Dissolved hydrogen concentration 0 ppm | Dissolved hydrogen concentration 0.2 ppm | Dissolved hydrogen concentration 0.5 ppm | Dissolved hydrogen concentration 1.0 ppm |
|---|---|---|---|---|
| Dissolved oxygen concentration 50 ppb | X | X | O | O |
| Dissolved oxygen concentration 100 ppb | X | X | O | O |
| Dissolved oxygen concentration 500 ppb | X | X | X | X |

X: Presence of $Si^{4+}$ peak   O: Absence of $Si^{4+}$ peak

Embodiment 4

An n type (111) silicon substrate having a substrate concentration of $1.1 \times 10^{19}/cm^3$ was cleaned for a period of 10 minutes in chemicals in which 97% sulfuric acid and 30% hydrogen peroxide were mixed in a volumetric ratio of 4:1, and after rinsing with ultrapure water at a flow rate of 1 L/min, the substrate was treated with 0.5 weight percent hydrofluoric acid for a period of one minute.

This substrate was then subjected to analysis using a Fourier transform infrared spectroscope having as the prism thereof a parallelogram type germanium crystal having a size of 50 mm×20 mm (and a thickness of 2 mm), the cross-sectional angles of which were 60°, and Si—H peaks were observed using various reflection methods.

On the other hand, after conducting washing using 0.5 weight percent hydrofluoric acid, the silicon substrates were immediately subjected to a flow of ultrapure water, the dissolved oxygen content and dissolved hydrogen content of which were regulated (at a flow rate of 500 ml/min), and these were retrieved from the chamber at certain intervals, and Si—H peaks were immediately observed using various reflection methods in a Fourier transform infrared spectroscope. The changes in the peak strength at this time for the case in which the dissolved oxygen content was 50 ppb are shown in Table 6, while those in the case in which the dissolved oxygen content was 100 ppb are shown in Table 7 and those in which the dissolved oxygen content was 500 ppb are shown in Table 8.

TABLE 6

|  | After 0 minutes | After 10 minutes | After 30 minutes | After 60 minutes | After 120 minutes |
|---|---|---|---|---|---|
| Dissolved hydrogen concentration 0 ppm | 1.0[1] | 1.2 | 1.8 | 2.5 | 2.5 |
| Dissolved hydrogen concentration 0.2 ppm | 1.0 | 1.7 | 2.5 | 3.2 | 3.2 |
| Dissolved hydrogen concentration 0.5 ppm | 1.0 | 4.3 | 6.5 | 8.2 | 8.3 |
| Dissolved hydrogen concentration 1.0 ppm | 1.0 | 4.5 | 6.7 | 8.1 | 8.4 |

[1]The intensity of the Si-H peak after hydrofluoric acid cleaning was set to a value of 1.0.

TABLE 7

|  | After 0 minutes | After 10 minutes | After 30 minutes | After 60 minutes | After 120 minutes |
|---|---|---|---|---|---|
| Dissolved hydrogen concentration 0 ppm | 1.0[1] | 1.2 | 1.8 | 2.2 | 2.1 |
| Dissolved hydrogen concentration 0.2 ppm | 1.0 | 1.7 | 2.5 | 2.9 | 2.7 |
| Dissolved hydrogen concentration 0.5 ppm | 1.0 | 4.2 | 6.4 | 8.1 | 8.2 |
| Dissolved hydrogen concentration 1.0 ppm | 1.0 | 4.4 | 6.6 | 8.2 | 8.2 |

[1]The intensity of the Si-H peak after hydrofluoric acid cleaning was set to a value of 1.0.

TABLE 8

|  | After 0 minutes | After 10 minutes | After 30 minutes | After 60 minutes | After 120 minutes |
|---|---|---|---|---|---|
| Dissolved hydrogen concentration 0 ppm | 1.0[1] | 1.2 | 1.1 | 0.9 | 0.8 |
| Dissolved hydrogen concentration 0.2 ppm | 1.0 | 1.5 | 1.4 | 1.2 | 1.0 |
| Dissolved hydrogen concentration 0.5 ppm | 1.0 | 3.2 | 2.8 | 2.5 | 2.2 |
| Dissolved hydrogen concentration 1.0 ppm | 1.0 | 3.7 | 3.3 | 3.0 | 2.6 |

[1]The intensity of the Si-H peak after hydrofluoric acid cleaning was set to a value of 1.0.

From the results in Tables 6, 7, and 8, it can be seen that it is necessary to maintain the dissolved oxygen concentration in the pure water or ultrapure water at a level of 100 ppb or less, and to maintain the dissolved hydrogen at a level of 0.5 ppm or more, in order to achieve hydrogen termination of the silicon surface. In the results of Table 8, an increase in the Si—H peak is observed even when the dissolved oxygen content was 500 ppb or more; however, from a period of 10 minutes of immersion, the Si—H peak decreases monotonically.

Embodiment 5

An 8 inch n type (100) silicon substrate having a resistivity within a range of 8–12 Ωcm was cleaned for a period of 10 minutes in chemicals in which 97% sulfuric acid and 30% hydrogen peroxide were mixed in a volumetric ratio of 4:1, and this was rinsed using ultrapure water at a flow rate of 1 L/min, and was then treated for a period of one minute using 0.5 weight percent hydrofluoric acid. After this, rinsing was conducted for a period of ten minutes using ultrapure water at a flow rate of 1 L/min.

Using alumina particles, approximately 3000 to 5000 particles larger than 0.17 microns were deposited on each substrate, to produce contaminated substrates.

Ultrapure water with a regulated amount of dissolved oxygen and dissolved hydrogen was caused to flow through a nozzle type frequency irradiation device (at a flow rate of 5 L/min) while conducting irradiation with a frequency of 1.6 MHz (an irradiation density of 13 W/cm$^2$), at and while rotating the substrate at 1000 rotations per minute, cleaning was conducted for a period of 20 minutes.

After cleaning, the substrate was rotated at 1500 revolutions per minute and drying was conducted, and the deposition state of large particles having a diameter of greater than 0.17 microns was observed in a particle counter, and the removal rate was obtained. The results thereof are shown in Table 9.

TABLE 9

|  | Dissolved hydrogen concentration 0 ppm | Dissolved hydrogen concentration 0.2 ppm | Dissolved hydrogen concentration 0.5 ppm | Dissolved hydrogen concentration 1.0 ppm |
|---|---|---|---|---|
| Dissolved oxygen concentration 50 ppb | 32.7% | 40.1% | 98.6% | 99.0% |
| Dissolved oxygen concentration 100 ppb | 29.7% | 37.5% | 98.4% | 98.9% |
| Dissolved oxygen concentration 500 ppb | 29.5% | 35.8% | 93.2% | 95.2% |

The results of comparative examples in which, in embodiment 5, there was no irradiation frequency, and in which cleaning was conducted while irradiating with a frequency of 500 kHz (an irradiation density of 13 W/cm$^2$), are shown in, respectively, Tables 10 and 11.

TABLE 10

|  | Dissolved hydrogen concentration 0 ppm | Dissolved hydrogen concentration 0.2 ppm | Dissolved hydrogen concentration 0.5 ppm | Dissolved hydrogen concentration 1.0 ppm |
|---|---|---|---|---|
| Dissolved oxygen concentration 50 ppb | 12.0% | 20.9% | 80.2% | 85.3% |
| Dissolved oxygen concentration 100 ppb | 12.2% | 15.7% | 75.3% | 81.0% |
| Dissolved oxygen concentration 500 ppb | 9.3% | 14.6% | 72.1% | 78.7% |

TABLE 11

|  | Dissolved hydrogen concentration 0 ppm | Dissolved hydrogen concentration 0.2 ppm | Dissolved hydrogen concentration 0.5 ppm | Dissolved hydrogen concentration 1.0 ppm |
|---|---|---|---|---|
| Dissolved oxygen concentration 50 ppb | 31.5% | 39.2% | 98.3% | 98.7% |
| Dissolved oxygen concentration 100 ppb | 28.0% | 36.8% | 98.2% | 98.9% |

TABLE 11-continued

|  | Dissolved hydrogen concentration 0 ppm | Dissolved hydrogen concentration 0.2 ppm | Dissolved hydrogen concentration 0.5 ppm | Dissolved hydrogen concentration 1.0 ppm |
| --- | --- | --- | --- | --- |
| Dissolved oxygen concentration 500 ppb | 29.2% | 34.8% | 81.3% | 87.6% |

Embodiment 7

An 8 inch n type (100) silicon substrate having a resistivity within a range of 8–12 Ωcm was cleaned for a period of 10 minutes in chemicals in which 97% sulfuric acid and 30% hydrogen peroxide were mixed in a volumetric ratio of 4:1, and this was rinsed using ultrapure water at a flow rate of 1 L/min, and was then treated for a period of one minute using 0.5 weight percent hydrofluoric acid. After this, rinsing was conducted for a period of ten minutes using ultrapure water at a flow rate of 1 L/min.

These substrates were then cleaned for a period of 20 seconds with solutions in which various concentrations of ozonated water were added to 0.5 weight percent hydrofluoric acid, so that the ozone concentrations of the solutions were different. Subsequently, rinsing was conducted for a period of 20 seconds with ultrapure water, and the deposition state of large particles of 0.17 microns or greater was observed using a particle counter. Furthermore, the presence of oxide films at this time was evaluated using X-ray photoelectric spectroscopy. The results of this are shown in Table 12.

TABLE 12

|  | Ozone concentration 0 ppm | Ozone concentration 1 ppm | Ozone concentration 2 ppm | Ozone concentration 10 ppm | Ozone concentration 11 ppm |
| --- | --- | --- | --- | --- | --- |
| Particle count (per 8 inch wafer) | 1110 | 615 | 12 | 13 | 10 |
| Presence/absence of $Si^{4+}$ peak (oxide film) | Absent | Absent | Absent | Absent | Present |

Embodiment 8

An 8 inch n type (100) silicon substrate having a resistivity within a range of 8–12 Ωcm was cleaned for a period of 10 minutes in chemicals in which 97% sulfuric acid and 30% hydrogen peroxide were mixed in a volumetric ratio of 4:1, and this was rinsed using ultrapure water at a flow rate of 1 L/min, and was then treated for a period of one minute using 0.5 weight percent hydrofluoric acid. After this, rinsing was conducted for a period of ten minutes using ultrapure water at a flow rate of 1 L/min.

These substrates were then cleaned for a period of 20 minutes with solutions in which various concentrations of hydrofluoric acid solutions were added to ozonated water having a concentration of 5 ppm, so that the hydrofluoric acid concentrations of the solutions were different. Subsequently, rinsing was conducted for a period of 20 seconds using ultrapure water, and the deposition state of large particles of 0.17 microns or greater was observed using a particle counter. Furthermore, the presence of oxide films at this time was evaluated using an X-ray photoelectric spectroscope, and the roughness of the surface was evaluated using an interatomic force microscope. The results of this are shown in Table 13.

TABLE 13

|  | Hydrofluoric acid concentration 0 wt % | Hydrofluoric acid concentration 0.01 wt % | Hydrofluoric acid concentration 0.05 wt % | Hydrofluoric acid concentration 1 wt % | Hydrofluoric acid concentration 2 wt % |
| --- | --- | --- | --- | --- | --- |
| Particle count (per 8 inch wafer) | 15 | 12 | 13 | 13 | 16 |
| Presence/absence of $Si^{4+}$ peak (oxide film) | Present | Present | Absent | Absent | Absent |
| Surface roughness (Ra) | 0.11 nm | 0.11 nm | 0.11 nm | 0.11 | 0.22 nm |

Embodiment 9

8 inch n type (100) silicon substrates having a resistivity within a range of 8–12 Ωcm were cleaned for a period of 10 minutes in chemicals in which 97% sulfuric acid and 30% hydrogen peroxide were mixed at a volumetric ratio of 4:1, rinsing was then conducted using ultrapure water at a flow rate of 1 L/min, and the substrates were then treated for a period of one minute using 0.5 weight percent hydrofluoric acid. After this, rinsing was conducted for a period of ten minutes using ultrapure water at a flow rate of 1 L/min.

These substrates were then cleaned for a period of 20 seconds using solutions in which water containing various concentrations of hydrogen peroxide was added to 0.5 weight percent hydrofluoric acid, so that the solutions had differing hydrogen peroxide concentrations. Subsequently, rinsing was conducted for a period of 20 seconds using ultrapure water, and the deposition state of large particles of 0.17 microns or greater was observed using a particle counter. Furthermore, the presence of oxide films at this time was evaluated using X-ray photoelectric spectroscopy and the roughness of the surface was evaluated using an interatomic force microscope. The results of this are shown in Table 14.

TABLE 14

|  | Hydrogen peroxide concentration 0 wt % | Hydrogen peroxide concentration 0.05 wt % | Hydrogen peroxide concentration 0.1 wt % | Hydrogen peroxide concentration 1 wt % | Hydrogen peroxide concentration 2 wt % |
| --- | --- | --- | --- | --- | --- |
| Particle count (per 8 inch wafer) | 1110 | 720 | 11 | 10 | 9 |
| Presence/ absence of $Si^{4+}$ peak (oxide film) | Absent | Absent | Absent | Absent | Absent |
| Surface roughness (Ra) | 0.11 nm | 0.11 nm | 0.11 nm | 0.11 nm | 0.19 nm |

Embodiment 10

8 inch n type (100) silicon substrates having a resistivity within a range of 8–12 Ωcm were cleaned for a period of 10 minutes in chemicals in which 97% sulfuric acid and 30% hydrogen peroxide were mixed at a volumetric ratio of 4:1, and then rinsed was conducted in ultrapure water at a flow rate of 1 L/min, and the substrates were treated for a period of one minute using 0.5 weight percent hydrofluoric acid. After this, rinsing was conducted for a period of ten minutes using ultrapure water at a flow rate of 1 L/min.

These substrates were cleaned for a period of 20 seconds with solutions in which hydrofluoric acid solutions having various concentrations were added to water having a hydrogen peroxide concentration of 0.5 weight percent, so that the solutions had differing hydrofluoric acid concentrations. Subsequently, rinsing was conducted for a period of 20 seconds using ultrapure water, and the deposition state of large particles of 0.17 microns or greater was observed using a particle counter. Furthermore, the presence of oxide films at this time was evaluated using X-ray photoelectric spectroscopy, and the roughness of the surface was evaluated using an interatomic force microscope. The results of this are shown in Table 15.

TABLE 15

|  | Hydrofluoric acid concentration 0 wt % | Hydrofluoric acid concentration 0.01 wt % | Hydrofluoric acid concentration 0.05 wt % | Hydrofluoric acid concentration 1 wt % | Hydrofluoric acid concentration 2 wt % |
| --- | --- | --- | --- | --- | --- |
| Particle count (per 8 inch wafer) | 9 | 12 | 14 | 8 | 10 |
| Presence/ absence of $Si^{4+}$ peak (oxide film) | Present | Present | Absent | Absent | Absent |
| Surface roughness (Ra) | 0.11 nm | 0.11 nm | 0.11 nm | 0.11 nm | 0.19 nm |

Embodiment 11

An n type (111) silicon substrate having a substrate concentration of $1.1\times10^{19}/cm^3$ was cleaned for a period of 10 minutes in chemicals in which 97% sulfuric acid and 30% hydrogen peroxide were mixed in a volumetric ratio of 4:1, rinsing was conducted in ultrapure water at a flow rate of 1 L/min, and cleaning was conducted for a period of 20 seconds by adding 5 ppm of ozonated water to 0.5 weight percent hydrofluoric acid.

The silicon substrates were then rinsed with ultrapure water having regulated concentrations of dissolved oxygen and dissolved hydrogen (with a flow rate of 500 ml/min), and these were retrieved at certain intervals, and the Si—H peaks thereof were immediately observed using various reflection methods and a Fourier transform infrared spectroscope. The changes in the peak strength at this time are shown in Table 16 for the case in which the concentration of the dissolved oxygen was 50 ppb, in Table 17 for the case in which the concentration of dissolved oxygen was 100 ppb and in Table 18 for the case in which the concentration of dissolved oxygen was 500 ppb.

TABLE 16

|  | After 0 minutes | After 10 minutes | After 30 minutes | After 60 minutes | After 120 minutes |
| --- | --- | --- | --- | --- | --- |
| Dissolved hydrogen concentration 0 ppm | 1.0[1] | 1.2 | 1.8 | 2.5 | 2.5 |
| Dissolved hydrogen concentration 0.2 ppm | 1.0 | 1.7 | 2.5 | 3.2 | 3.2 |
| Dissolved hydrogen concentration 0.5 ppm | 1.0 | 5.2 | 7.7 | 9.5 | 9.7 |
| Dissolved hydrogen concentration 1.0 ppm | 1.0 | 5.4 | 8.2 | 9.7 | 9.8 |

[1]The intensity of the Si—H peak after cleaning with a cleaning liquid, in which 5 ppm ozonated water and 0.5 weight percent hydrofluoric acid were added, was set to a value of 1.0.

TABLE 17

| | After 0 minutes | After 10 minutes | After 30 minutes | After 60 minutes | After 120 minutes |
|---|---|---|---|---|---|
| Dissolved hydrogen concentration 0 ppm | 1.0[1] | 1.2 | 1.8 | 2.2 | 2.1 |
| Dissolved hydrogen concentration 0.2 ppm | 1.0 | 1.6 | 2.2 | 2.8 | 2.7 |
| Dissolved hydrogen concentration 0.5 ppm | 1.0 | 5.2 | 7.8 | 9.3 | 9.5 |
| Dissolved hydrogen concentration 1.0 ppm | 1.0 | 5.3 | 7.9 | 9.5 | 9.7 |

[1]The intensity of the Si—H peak after cleaning with a cleaning liquid, in which 5 ppm ozonated water and 0.5 weight percent hydrofluoric acid were added, was set to a value of 1.0.

TABLE 18

| | After 0 minutes | After 10 minutes | After 30 minutes | After 60 minutes | After 120 minutes |
|---|---|---|---|---|---|
| Dissolved hydrogen concentration 0 ppm | 1.0[1] | 1.1 | 1.0 | 0.8 | 0.7 |
| Dissolved hydrogen concentration 0.2 ppm | 1.0 | 1.3 | 1.3 | 1.1 | 0.9 |
| Dissolved hydrogen concentration 0.5 ppm | 1.0 | 2.9 | 2.5 | 2.3 | 2.0 |
| Dissolved hydrogen concentration 1.0 ppm | 1.0 | 3.4 | 3.0 | 2.7 | 2.3 |

[1]The intensity of the Si—H peak after cleaning with a cleaning liquid, in which 5 ppm ozonated water and 0.5 weight percent hydrofluoric acid were added, was set to a value of 1.0

Embodiment 12 n type (111) silicon substrates having a substrate concentration of $1.1 \times 10^{19}/cm^3$ were cleaned for a period of 10 minutes in chemicals in which 97% sulfuric acid and 30% hydrogen peroxide were mixed in a volumetric ratio of 4:1, rinsing was conducted in ultrapure water at a flow rate of 1 L/min, and cleaning was conducted for a period of 20 seconds in a solution in which a 0.5 weight percent solution of hydrogen peroxide in water was added to 0.5 weight percent hydrofluoric acid.

The silicon substrates were immediately subjected to rinsing with ultrapure water having regulated concentrations of dissolved oxygen and dissolved hydrogen (with a flow rate of 500 ml/min), these were retrieved at certain intervals, and the Si—H peaks thereof were immediately observed using various reflection methods and a Fourier transform infrared spectroscope. The changes in the peak strength at this time are shown in Table 19 for the case in which the concentration of the dissolved oxygen was 50 ppb, in Table 20 for the case in which the concentration of dissolved oxygen was 100 ppb and in Table 21 for the case in which the concentration of dissolved oxygen was 500 ppb.

TABLE 19

| | After 0 minutes | After 10 minutes | After 30 minutes | After 60 minutes | After 120 minutes |
|---|---|---|---|---|---|
| Dissolved hydrogen concentration 0 ppm | 1.0[1] | 1.2 | 1.8 | 2.5 | 2.5 |
| Dissolved hydrogen concentration 0.2 ppm | 1.0 | 1.7 | 2.5 | 3.2 | 3.2 |
| Dissolved hydrogen concentration 0.5 ppm | 1.0 | 4.9 | 7.3 | 8.9 | 9.1 |
| Dissolved hydrogen concentration 1.0 ppm | 1.0 | 5.0 | 7.3 | 9.1 | 9.2 |

[1]The intensity of the Si—H peak after cleaning with a cleaning liquid, in which 0.5 weight percent hydrogen peroxide in water and 0.5 weight percent hydrofluoric acid were added, was set to a value of 1.0.

TABLE 20

| | After 0 minutes | After 10 minutes | After 30 minutes | After 60 minutes | After 120 minutes |
|---|---|---|---|---|---|
| Dissolved hydrogen concentration 0 ppm | 1.0[1] | 1.2 | 1.7 | 2.2 | 2.1 |
| Dissolved hydrogen concentration 0.2 ppm | 1.0 | 1.7 | 2.4 | 2.9 | 2.7 |
| Dissolved hydrogen concentration 0.5 ppm | 1.0 | 4.8 | 7.2 | 9.1 | 9.0 |
| Dissolved hydrogen concentration 1.0 ppm | 1.0 | 5.0 | 7.4 | 9.2 | 9.1 |

[1]The intensity of the Si—H peak after cleaning with a cleaning liquid, in which 0.5 weight percent hydrogen peroxide in water and 0.5 weight percent hydrofluoric acid were added, was set to a value of 1.0.

TABLE 21

| | After 0 minutes | After 10 minutes | After 30 minutes | After 60 minutes | After 120 minutes |
|---|---|---|---|---|---|
| Dissolved hydrogen concentration | 1.0[1] | 1.1 | 1.0 | 0.8 | 0.7 |

TABLE 21-continued

| | After 0 minutes | After 10 minutes | After 30 minutes | After 60 minutes | After 120 minutes |
|---|---|---|---|---|---|
| 0 ppm Dissolved hydrogen concentration 0.2 ppm | 1.0 | 1.3 | 1.2 | 1.1 | 0.9 |
| Dissolved hydrogen concentration 0.5 ppm | 1.0 | 2.9 | 2.5 | 2.3 | 2.0 |
| Dissolved hydrogen concentration 1.0 ppm | 1.0 | 3.4 | 3.0 | 2.7 | 2.3 |

[1)]The intensity of the Si—H peak after cleaning with a cleaning liquid, in which 0.5 weight percent hydrogen peroxide in water and 0.5 weight percent hydrofluoric acid were added, was set to a value of 1.0.

What is claimed is:

1. A cleaning method for semiconductor cleaning, consisting essentially of:

a first step, in which cleaning is conducted using pure water containing of ozone;

a second step, in which cleaning is conducted using a cleaning liquid consisting HF, $H_2O$, and a surfactant, while applying vibration having a frequency of 500 kHz or more;

a third step, in which cleaning is conducted using pure water containing ozone;

a fourth step, in which cleaning is conducted using a cleaning liquid containing HF and $H_2O$ in order to remove oxide films; and a fifth step, in which cleaning is conducted using pure water.

2. A cleaning method in accordance with claim 1, wherein hydrogen is added to the pure water used in the fifth step.

3. A cleaning method in accordance with claim 1, wherein the ozone concentration within the pure water containing ozone in the first step and the third step is within a range of 2 ppm to 10 ppm.

4. A cleaning method in accordance with claim 1, wherein the ozone concentration in the pure water containing ozone in the first step and the third step is identical.

5. A cleaning method in accordance with claim 1, wherein the HF concentration in the second step is within a range of 0.05 weight percent to 0.5 weight percent.

6. A cleaning method in accordance with claim 2, wherein the concentration of hydrogen added in the fifth step is within a range of 0.01 ppm to 1.6 ppm.

* * * * *